(12) United States Patent
Orr

(10) Patent No.: US 8,102,183 B2
(45) Date of Patent: Jan. 24, 2012

(54) MEASURING ELECTRICAL IMPEDANCE AT VARIOUS FREQUENCIES

(75) Inventor: Timothy Orr, London Greater London (GB)

(73) Assignee: Orrcam Limited, Greater London (GB)

( * ) Notice: Subject to any disclaimer, the term of this patent is extended or adjusted under 35 U.S.C. 154(b) by 780 days.

(21) Appl. No.: 12/097,402

(22) PCT Filed: Dec. 4, 2006

(86) PCT No.: PCT/GB2006/050425
§ 371 (c)(1),
(2), (4) Date: Jun. 13, 2008

(87) PCT Pub. No.: WO2007/068972
PCT Pub. Date: Jun. 21, 2007

(65) Prior Publication Data
US 2008/0303538 A1      Dec. 11, 2008

(30) Foreign Application Priority Data
Dec. 16, 2005   (GB) .................................. 0525625.0

(51) Int. Cl.
G01R 27/08 (2006.01)
G01R 31/08 (2006.01)
(52) U.S. Cl. ........................................ 324/713; 324/525
(58) Field of Classification Search .................. 324/707, 324/713, 525
See application file for complete search history.

(56) References Cited

U.S. PATENT DOCUMENTS

| 3,825,825 A | | 7/1974 | Smolka | |
|---|---|---|---|---|
| 4,815,001 A | * | 3/1989 | Uthe et al. | ..................... 700/212 |
| 6,502,046 B1 | * | 12/2002 | Yoon et al. | ....................... 702/76 |

FOREIGN PATENT DOCUMENTS

| EP | 0 247 291 | 12/1987 |
|---|---|---|
| GB | 2 261 075 | 5/1993 |
| WO | WO 00/55639 | 9/2000 |

OTHER PUBLICATIONS

International Search Report of PCT/GB2006/050425.
Written Opinion of the International Search Authority of PCT/GB2006/050425.
International Prelim Report on Patentability for PCT/GB2006/050425.

* cited by examiner

*Primary Examiner* — Amy He
(74) *Attorney, Agent, or Firm* — Martin Fleit; Paul D. Bianco; Fleit Gibbons Gutman Bongini & Bianco PL

(57) ABSTRACT

A logarithmic level detector (9) produces analog signals that represent logarithms of the voltage across, and current through, a target device (7). These signals are then passed to a processor (1) that performs a digital conversion. Because the digital conversion takes place after logarithmic conversion, it becomes possible to obtain an appropriate resolution for all signal levels, and a calculation of impedance of a target device, with reduced error, is enabled.

18 Claims, 1 Drawing Sheet

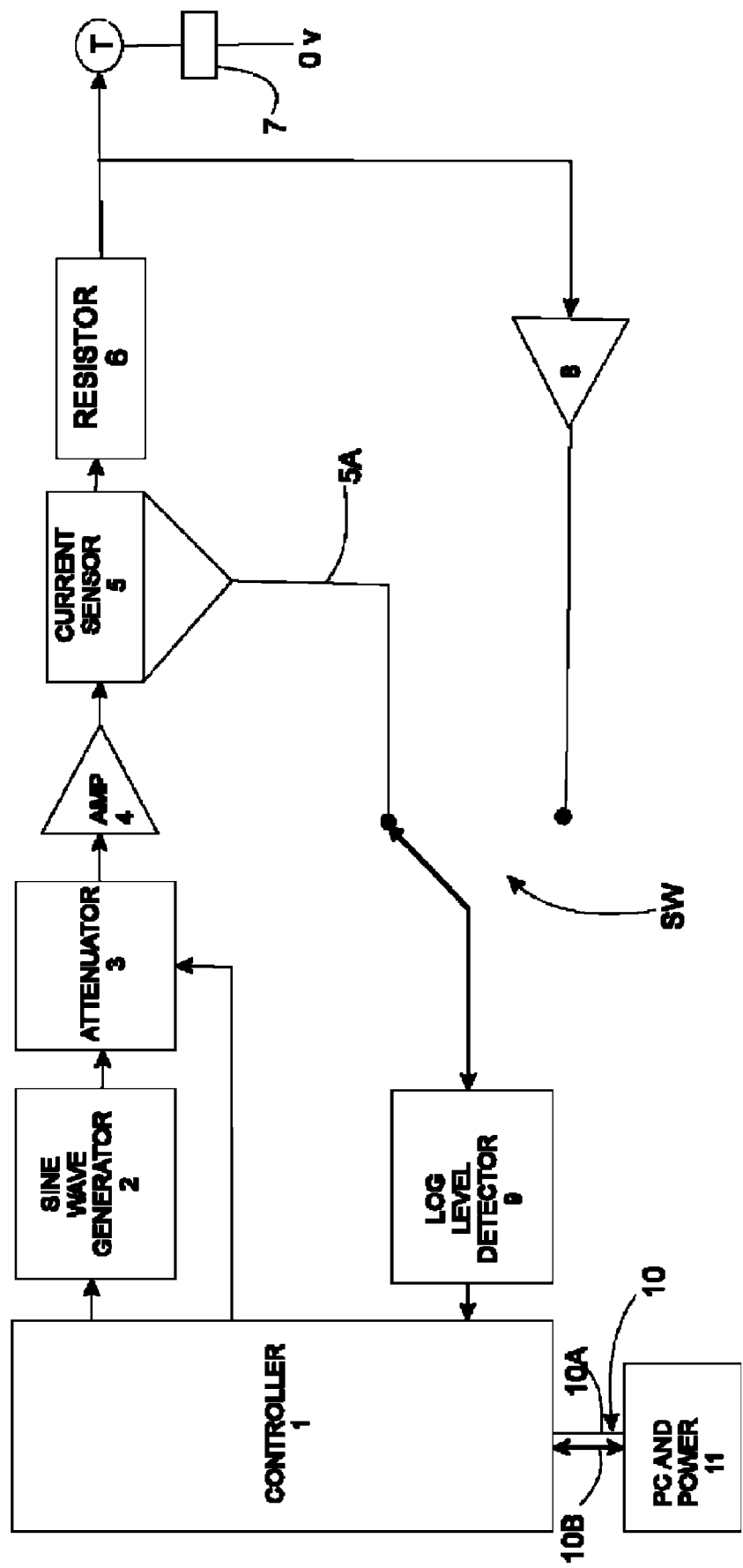

MEASURING ELECTRICAL IMPEDANCE AT VARIOUS FREQUENCIES

This invention relates to an instrument for measuring impedance. It is normal practice, in instruments for measuring impedance, to synthesise a sine wave from a look-up table and to apply it to the target device ie to a device whose impedance is to be measured. Linear analogue-to-digital converters are then used to produce data samples representing the steady state sinusoidal voltage across and the steady state sinusoidal current through the target device. These data samples allow impedance and other characteristics of the target device to be measured as a function of frequency.

The linear A/D conversion used in this known method has a resolution that worsens with reducing signal level. To overcome this problem, various gain switching mechanisms have been used to maintain a good resolution at low signal levels. However, this technique adds to the size, weight and cost of the instrument and produces discontinuities in the results.

For an instrument that is designed to operate at up to say 4 MHz, the A/D converter will need to operate at a sampling rate of say 40 MHz. This requires considerable power both in the A/D conversion process and in the processing of the large number of digital signals. Typically, a system like this might require 5 Watts or more. To provide this power it is normally necessary to include a mains power supply as part of the instrument. This adds to complexity, weight and cost; and also introduces the problem that the power supply can introduce noise and interfering signals into the target device.

According to the invention there is provided an instrument for measuring electrical impedance of a target device by generating a test signal, applying it to the target device and processing resulting signals indicative of the voltage across and the current through the target device; characterised in that the means for processing includes means for producing analogue signals representing logarithms of the magnitude of the voltage across and the magnitude of the current through the target device; and means for converting the analogue signals to digital form.

Because the digital conversion takes place after logarithmic conversion, it becomes possible to obtain an appropriate resolution for all signal levels without the need for any gain switching mechanism.

A further benefit of employing the invention is that, when obtaining a measure of impedance, using an equation such as $\log z = \log v - \log i$, slope errors introduced during the A/D conversion process are self cancelling because of the subtraction of the logarithms (equivalent to division).

One way of employing the invention will now be described by way of example with reference to the accompanying drawing, which is a block diagram of a measuring instrument constructed in accordance with the invention.

Referring to the drawing, a controller 1 is a 16/32 bit device. It has internal program and data memory, six ADC channels, various I/O ports and a USB function. It delivers a 28 bit number to a direct digital synthesis sine wave generator 2. This increments a phase accumulator which in turn moves a pointer through a sine wave ROM. The resulting digital output is presented to a 10 bit DAC which generates, at the output of block 2, a sequence of sine waves of different frequencies.

The output of the sine wave generator 2 is attenuated by a "set level" device 3. Here, a 6 bit code allows the amplitude of the sine wave to be set over a range of 0 dB to −60 dB in 2.5 dB steps. This unit is used to control internal calibration levels and allows the user to set the output test levels.

The test signal then passes through a wide band (200 MHz) op amp 4 to a current sensing amplifier 5. This is a purpose built, differential, wide band, very high CMRR op amp and is controlled by the controller 1 so that it is activated only during current measurement to reduce power consumption. It produces a voltage on line 5A representing a measurement of current through the sensor 5.

The test signal then passes through a 30 ohm resistor 6, which protects against external abuse, to a terminal T, which, in this particular embodiment, is part of a co-axial connector having two terminals. A target device 7 to be tested is connected between this terminal T and a reference voltage 0v.

The voltage at terminal T is applied to a high impedance buffer in the form of an input amplifier 8. This is a low noise, fast FET buffer. It is AC coupled with a 0.15 Hz break frequency. The input resistance is set by a 1 M ohm resistor and there is parasitic capacitance of more than 15 pF. The input is protected against voltages of 50 VAC.

The output of the buffer 8 passes to a voltage/current switch SW. The latter operates at high speed so as to feed alternately analogue current measurements i from sensor 5 and analogue voltage measurements v from the buffer 8 to a logarithmic level detector 9. The switch is a two way switch with taps to ground for the non-selected path. The switch is implemented with three low resistance analogue MUX switches.

The level detector 9 calculates, for each frequency value generated at 2, a pair of measurements log v and log i. These measurements are subtracted in the processor to give a value $\log z = \log v - \log i$, where z is the impedance of the target device 7 at the relevant frequency. Software in the processor 1 is designed to assemble this information into a form suitable for display as a graph of frequency against the log of the impedance. This data is fed along the data conductor 10A of a USB connector 10 to a computer 11 where the information is displayed and stored.

The invention claimed is:

1. An instrument for measuring electrical impedance of a target device by generating a test signal, applying it to the target device and processing resulting signals indicative of the voltage across and the current through the target device, the instrument comprising:
    a common mechanism for producing analog signals representing logarithms of voltage across and the current through the target device;
    means for alternately switching voltage and current measurements to that common mechanism; and
    means for converting the analog signals from the common mechanism to digital form and using the digitally converted signals from the common mechanism to derive an impedance measurement.

2. An instrument according to claim 1, further including a connector for linking the instrument to a computer, the connector having a power conductor for receiving power from the computer, wherein the instrument is designed to be driven by power received from the power conductor.

3. An instrument according to claim 2, wherein the connector has also a data conductor for transmitting the aforesaid digital signals to the computer.

4. An instrument according to claim 1, wherein the common mechanism is a single logarithmic level detector for producing the analogue signals representing logarithms of the voltage across and the current through the device.

5. An instrument for measuring electrical impedance of a target device as a function of frequency, comprising:
    a test signal generator operative to produce a test signal that may be applied to the target device to produce signals indicative of the voltage across, and the current through, the target device;

a single logarithmic level detector operative to alternately produce an analog signal representing a logarithm of the voltage across the target device, and an analog signal representing a logarithm of the current through the target device;

a switch operative to alternately connect a signal indicative of the voltage across the target device, and the current through the target device, to the single logarithmic level detector; and an analog to digital converter connected to the analog signal produced by the single logarithmic level detector; and a digital processor operative to calculate the measurement of impedance using the digitally converted alternating analog signals of the single logarithmic level detector.

6. The instrument of claim 5, wherein the processor uses the formula log z=log v−log i to calculate the measure of impedance, where log v is associated with the analog signal of the single logarithmic level detector corresponding to the voltage across the target device, and log i is associated with the analog signal of the single logarithmic level detector corresponding to the current through the target device.

7. The instrument of claim 5, wherein the digital processor is a 16/32 bit device with an internal program and data memory.

8. The instrument of claim 5, further including a USB circuit and connector, wherein the instrument is powered by, and may communicate with a computer, using the USB circuit and connector.

9. The instrument of claim 5, wherein the test signal is output by a sine wave generator.

10. The instrument of claim 9, wherein the output of the sine wave generator may be set over a range.

11. The instrument of claim 10, wherein the output may be set over a range of 0 dB to −60 dB.

12. The instrument of claim 5, further including a current sensor, and a CMRR (common-mode rejection ratio) differential amplifier which produces a voltage representing a measurement of current through the sensor.

13. The instrument of claim 12, wherein the differential amplifier produces a voltage only during current measurement to reduce power consumption.

14. The instrument of claim 5, wherein a voltage across the target device is applied to a high impedance FET buffer.

15. The instrument of claim 14, wherein an output of the FET buffer is passed to a voltage/current two way switch with taps to ground for a non-selected path.

16. An instrument for measuring electrical impedance of a target device as a function of frequency, comprising:

a test signal generator operative to produce a test signal that may be applied to the target device to produce signals indicative of the voltage across, and the current through, the target device;

a single logarithmic level detector operative to alternately produce an analog signal representing a logarithm of the voltage across the target device, and an analog signal representing a logarithm of the current through the target device;

a switch operative to alternately connect a signal indicative of the voltage across the target device, and the current through the target device, to the single logarithmic level detector;

an analog to digital converter connected to the alternating analog signals produced by the single logarithmic level detector; and a digital processor operative to calculate the measure of impedance using the formula log z=log v −log i, using the digitally converted alternating analog signals of the single logarithmic level detector.

17. The instrument of claim 16, further including a USB circuit and connector, wherein the instrument is powered by, and may communicate with a computer, using the USB circuit and connector.

18. The instrument of claim 16, further including a current sensor, and a CMRR (common-mode rejection ratio) differential amplifier which produces a voltage representing a measurement of current through the sensor.

* * * * *